(12) United States Patent
Qu et al.

(10) Patent No.: US 12,078,672 B2
(45) Date of Patent: *Sep. 3, 2024

(54) HEAT SPREADERS FOR USE IN SEMICONDUCTOR DEVICE TESTING, SUCH AS BURN-IN TESTING

(71) Applicant: Micron Technology, Inc., Boise, ID (US)

(72) Inventors: Xiaopeng Qu, Boise, ID (US); Amy R. Griffin, Boise, ID (US); Wesley J. Orme, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 171 days.

This patent is subject to a terminal disclaimer.

(21) Appl. No.: 17/829,224

(22) Filed: May 31, 2022

(65) Prior Publication Data

US 2022/0291280 A1   Sep. 15, 2022

Related U.S. Application Data

(63) Continuation of application No. 16/546,648, filed on Aug. 21, 2019, now Pat. No. 11,372,043.

(51) Int. Cl.
  G01R 31/28   (2006.01)
(52) U.S. Cl.
  CPC .... G01R 31/2863 (2013.01); G01R 31/2875 (2013.01); G01R 31/2879 (2013.01)
(58) Field of Classification Search
  CPC ............ G01R 31/2856; G01R 31/2875; G01R 31/2877
  See application file for complete search history.

(56) References Cited

U.S. PATENT DOCUMENTS

| 5,123,850 A | 6/1992 | Elder et al. |
| 5,923,179 A | 7/1999 | Taylor |

(Continued)

FOREIGN PATENT DOCUMENTS

| CN | 1891021 A | 1/2007 |
| CN | 105600739 A | 5/2016 |

(Continued)

OTHER PUBLICATIONS

CN Patent Application No. 202010850731.0—Chinese Office Action and Search Report, dated Jan. 29, 2024, with English Translation, 23 pages.

(Continued)

*Primary Examiner* — Tung X Nguyen
(74) *Attorney, Agent, or Firm* — Perkins Coie LLP

(57) ABSTRACT

Heat spreaders for use in semiconductor device testing, such as burn-in testing, are disclosed herein. In one embodiment, a heat spreader is configured to be coupled to a burn-in testing board including a plurality of sockets. The heat spreader includes (i) a frame having a plurality of apertures, and (ii) a plurality of heat sinks movably positioned within corresponding ones of the apertures. When the heat spreader is coupled to the burn-in testing board, the heat sinks are configured to extend into corresponding ones of the sockets to thermally contact semiconductor devices positioned within the sockets. The heat spreader can promote a uniform temperature gradient across the burn-in board during testing of the semiconductor devices.

20 Claims, 12 Drawing Sheets

(56) References Cited

U.S. PATENT DOCUMENTS

| | | |
|---|---|---|
| 6,213,806 B1 | 4/2001 | Choy |
| 6,219,241 B1 * | 4/2001 | Jones .................. H05K 7/1007 |
| | | 439/342 |
| 6,313,652 B1 | 11/2001 | Maeng |
| 6,323,665 B1 | 11/2001 | Johnson et al. |
| 6,744,269 B1 | 6/2004 | Johnson et al. |
| 7,042,240 B2 | 5/2006 | Lopez et al. |
| 7,097,488 B2 | 8/2006 | Hayakawa et al. |
| 8,564,317 B2 | 10/2013 | Han et al. |
| 2002/0075024 A1 | 6/2002 | Fredeman et al. |
| 2005/0146343 A1 | 7/2005 | Wright et al. |
| 2005/0206368 A1 * | 9/2005 | Lopez ................. G01R 31/2891 |
| | | 374/E1.021 |
| 2013/0242496 A1 | 9/2013 | Aria et al. |
| 2016/0141831 A1 | 5/2016 | Li et al. |
| 2019/0090343 A1 | 3/2019 | Mische |
| 2019/0120896 A1 | 4/2019 | Chen |
| 2019/0132938 A1 | 5/2019 | Mira et al. |
| 2021/0055342 A1 | 2/2021 | Qu et al. |
| 2021/0055343 A1 | 2/2021 | Qu et al. |

FOREIGN PATENT DOCUMENTS

| | | |
|---|---|---|
| CN | 205488165 U | 8/2016 |
| CN | 106443409 A | 2/2017 |
| CN | 207263849 U | 4/2018 |
| CN | 109983572 A | 7/2019 |
| DE | 4402010 A1 | 7/1995 |
| DE | 202008001996 U1 | 6/2008 |
| JP | 2004056063 A | 2/2004 |
| JP | 2004063919 A | 2/2004 |
| JP | 2005337835 A | 12/2005 |
| WO | 0213261 A2 | 2/2002 |
| WO | 2015111984 A1 | 7/2015 |

OTHER PUBLICATIONS

CN Patent Application No. 202010841938.1—Chinese Office Action and Search Report, dated Jan. 5, 2024, with English Translation, 18 pages.

Notice of Allowance and Search Report mailed on Jun. 26, 2024 for Chinese Patent Application No. 202010850731.0: 4 pages.

* cited by examiner

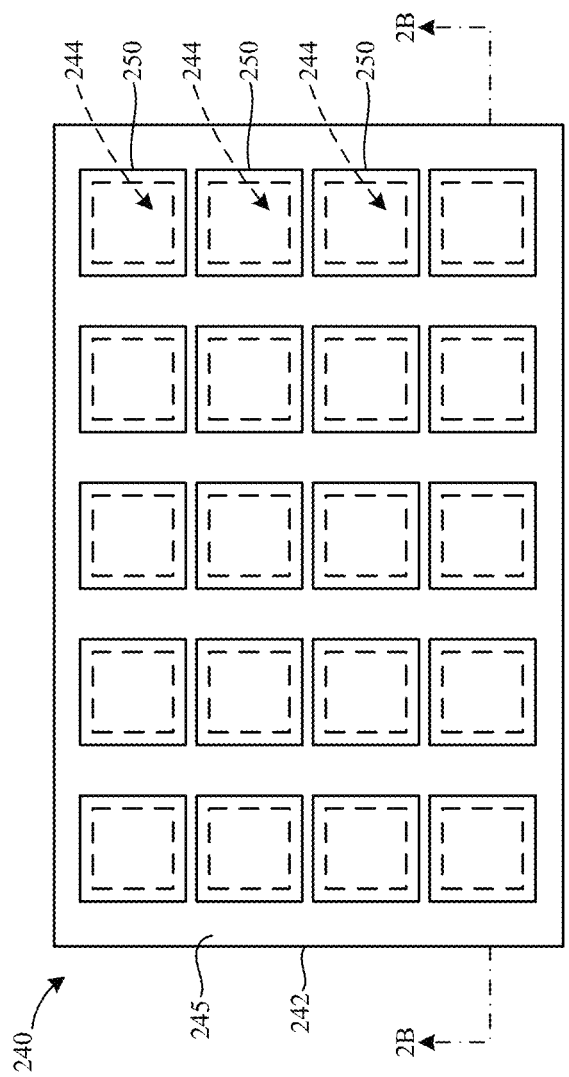
*FIG. 2A*
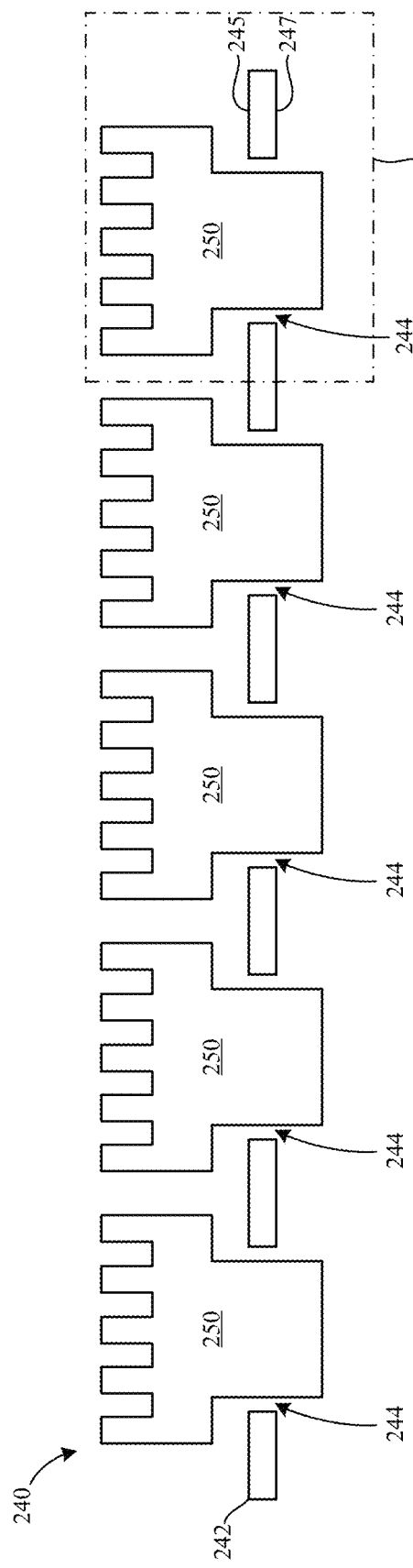
*FIG. 2B*
*FIG. 2C*

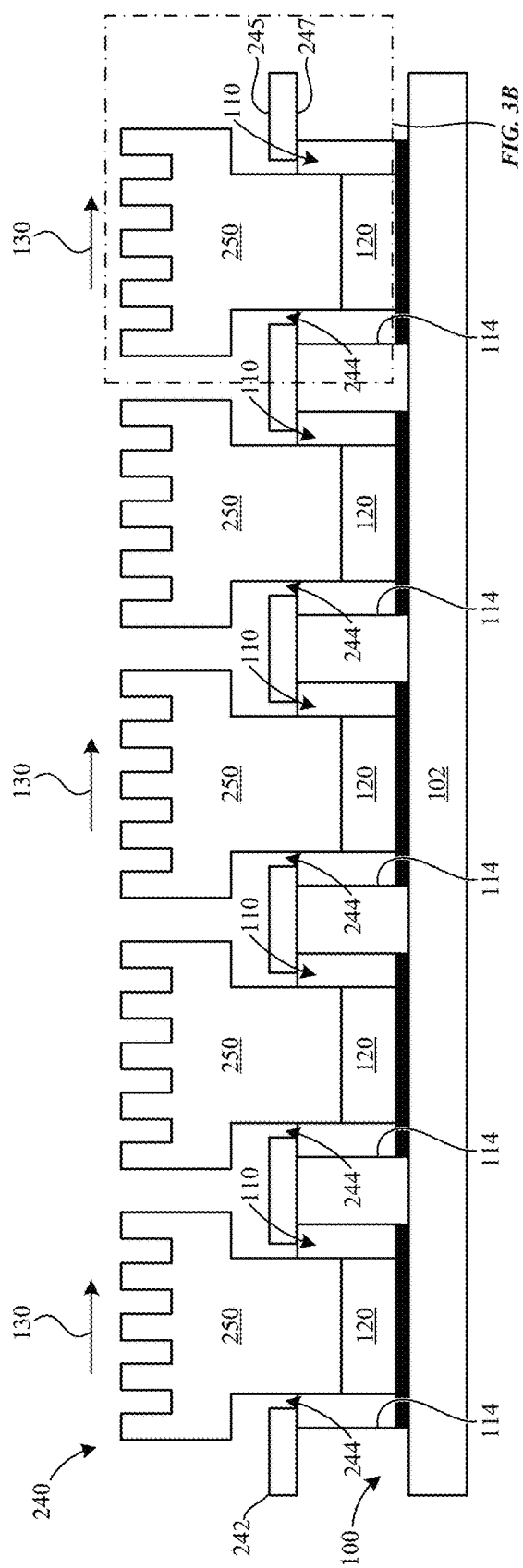
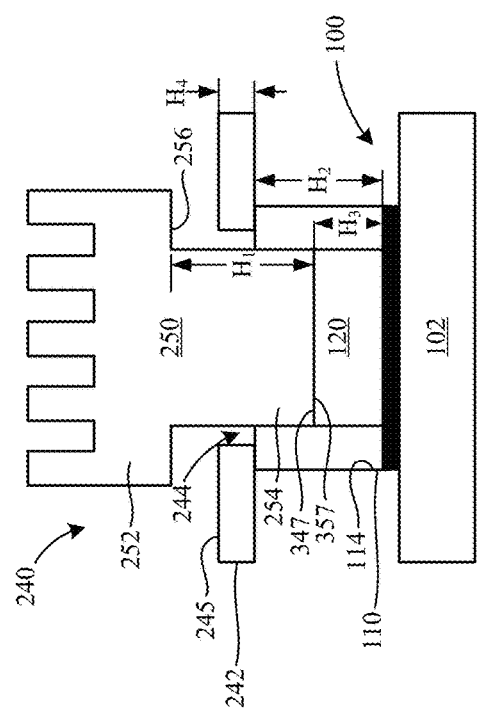
FIG. 3A
FIG. 3B

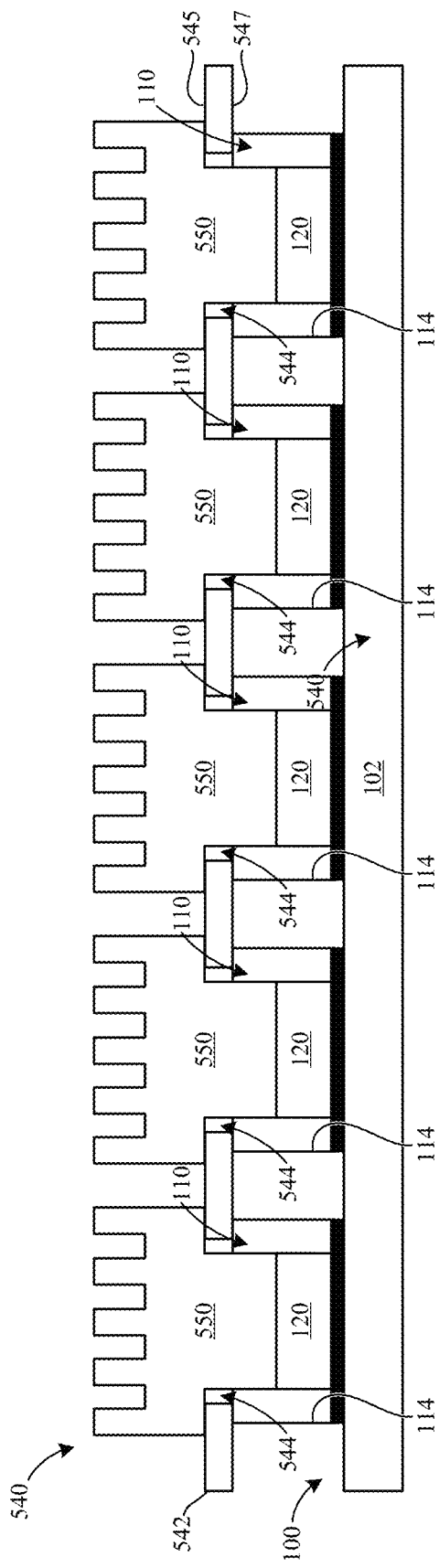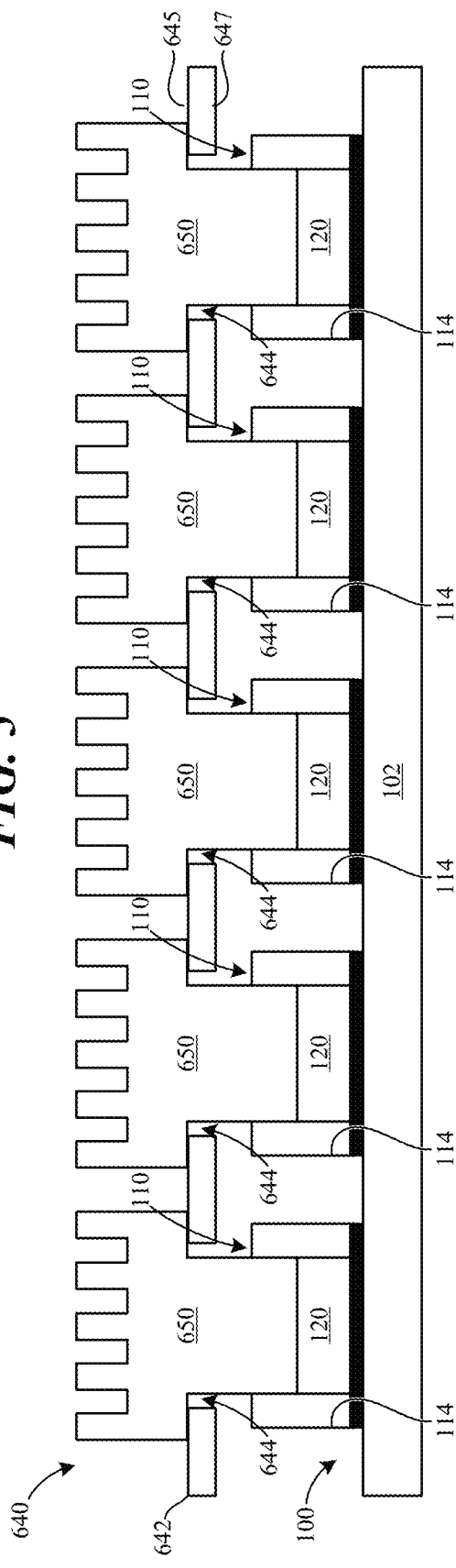

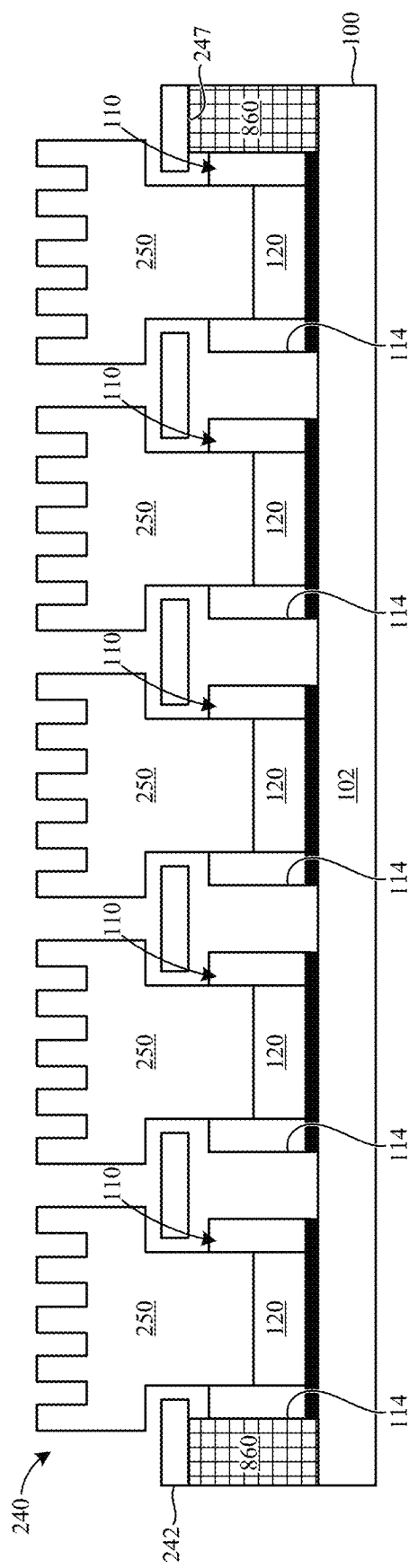
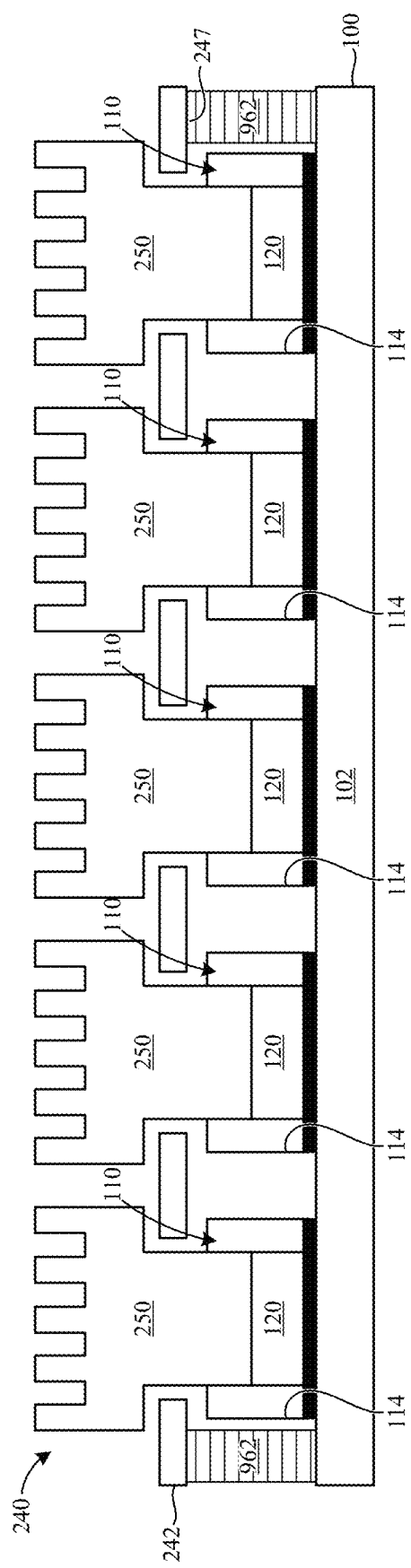
FIG. 8
FIG. 9

HEAT SPREADERS FOR USE IN SEMICONDUCTOR DEVICE TESTING, SUCH AS BURN-IN TESTING

CROSS-REFERENCE TO RELATED APPLICATIONS

This application is a continuation of U.S. application Ser. No. 16/546,648, filed Aug. 21, 2019, and titled "HEAT SPREADERS FOR USE IN SEMICONDUCTOR DEVICE TESTING, SUCH AS BURN-IN TESTING," which is incorporated herein by reference in its entirety.

This application contains subject matter related to U.S. patent application Ser. No. 16/546,674, filed Aug. 21, 2019, titled "HEAT SPREADERS FOR USE IN SEMICONDUCTOR DEVICE TESTING, SUCH AS BURN-IN TESTING", the disclosure of which is incorporated by reference herein in its entirety.

TECHNICAL FIELD

The present technology generally relates to heat spreaders for use during semiconductor device testing, and more particularly relates to heat spreaders configured to be thermally coupled to a plurality of semiconductor devices during burn-in testing.

BACKGROUND

Packaged semiconductor dies—including memory chips, microprocessor chips, MEMs, and imager chips—typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Semiconductor manufacturers often test semiconductor packages after or during fabrication to verify the reliability of the packages. One such verification process is burn-in testing, in which some of or all the components of a semiconductor package are exercised prior to being placed in service (and sometimes before the package is fully assembled). In general, burn-in testing includes placing the semiconductor package under an electrical load (e.g., near the operating limits of the package) for a predetermined time and at an elevated temperature (e.g., near a maximum operating temperature of the package). Typically, during a burn-in test, a plurality of semiconductor packages are connected to the sockets of a burn-in board, which provides the electrical load, and the burn-in board is placed in a heated chamber during the test. Those packages that do not function after the burn-in test are scrapped.

BRIEF DESCRIPTION OF THE DRAWINGS

Many aspects of the present technology can be better understood with reference to the following drawings. The components in the drawings are not necessarily to scale. Instead, emphasis is placed on clearly illustrating the principles of the present technology.

FIG. 2A is a top view of a heat spreader configured in accordance with embodiments of the present technology; FIG. 2B is a side-cross sectional view of the heat spreader taken along the line 2B-2B in FIG. 2A.

FIG. 3A is a side cross-sectional view of the heat spreader of FIGS. 2A-2C coupled to the burn-in board 100 of FIGS. 1A-1C in accordance with embodiments of the present technology; and FIG. 3B is an enlarged view of a portion of the heat spreader and the burn-in board shown in FIG. 3A.

FIG. 5 is a side cross-sectional view of the burn-in board of FIGS. 1A-1C having a heat spreader coupled thereto in accordance with another embodiment of the present technology.

FIG. 6 is a side cross-sectional view of the burn-in board of FIGS. 1A-1C having a heat spreader coupled thereto in accordance with another embodiment of the present technology.

FIG. 8 is a side-cross sectional view of the heat spreader of FIGS. 2A-2C coupled to the burn-in board of FIGS. 1A-1C in accordance with another embodiment of the present technology.

FIG. 9 is a side-cross sectional view of the heat spreader of FIGS. 2A-2C coupled to the burn-in board of FIGS. 1A-1C in accordance with another embodiment of the present technology.

DETAILED DESCRIPTION

Figure 1A:
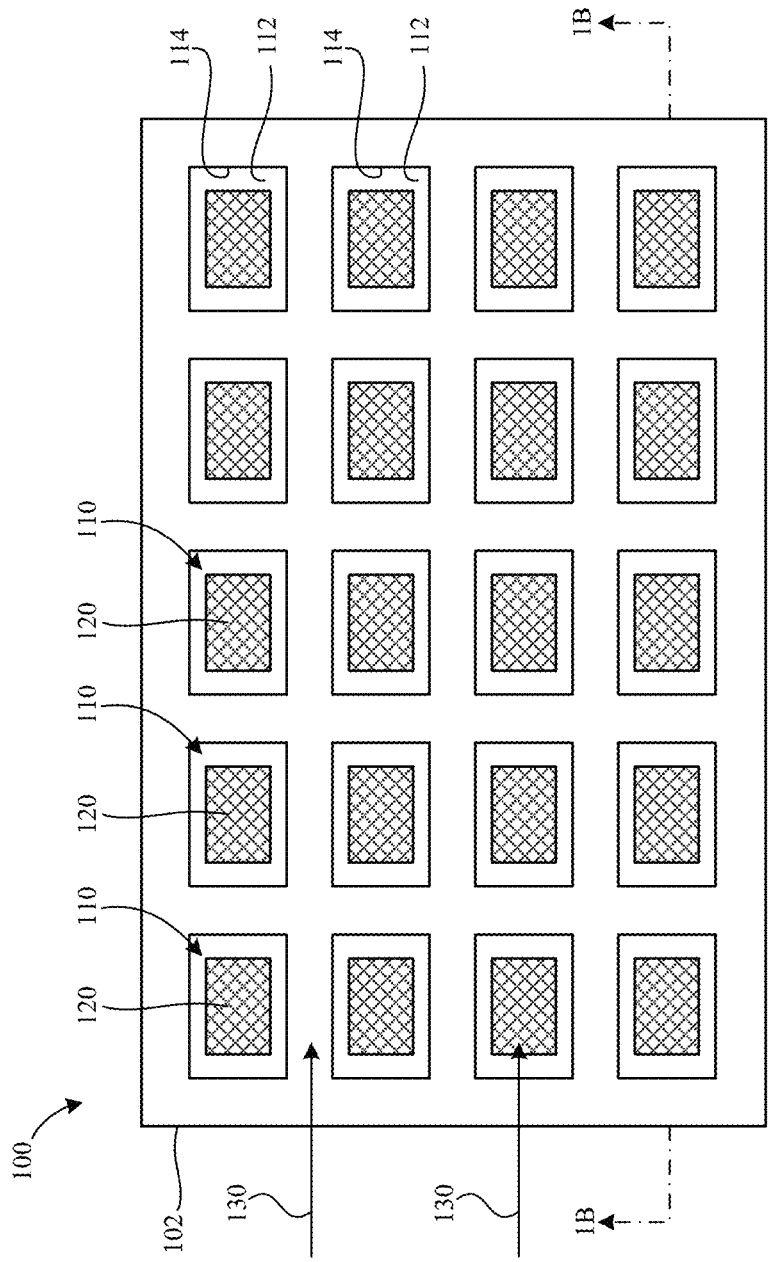
FIG. 1A is a top view of a burn-in board configured in accordance with embodiments of the present technology.

Specific details of several embodiments of burn-in boards having heat spreaders, and associated systems and methods, are described below with reference to FIGS. 1A-12. In several of the embodiments, a burn-in board includes a plurality of sockets configured to receive semiconductor devices therein during a testing procedure (e.g., a burn-in test). The testing procedure can include heating the burn-in board and the semiconductor devices to a selected test temperature while electrically exercising the semiconductor devices to, for example, weed out faulty devices. A heat spreader is thermally coupled to the semiconductor devices during the testing procedure. The heat spreader can include (i) a frame having a plurality of apertures and (ii) a plurality of heat sinks movably (e.g., slidably) positioned within corresponding ones of the apertures. The apertures are configured to be aligned over corresponding ones of the sockets, and the heat sinks are configured to extend into corresponding ones of the sockets to thermally contact the semiconductor devices.

One challenge with burn-in testing is maintaining each of the semiconductor packages connected to the burn-in board at the selected test temperature. Semiconductor packages that are below the selected test temperature (i.e., understressed) can prematurely fail in the field, while semiconductor packages that are above the selected test temperature may exceed their maximum operating temperature, resulting in false failures and destruction of otherwise marketable devices. In one aspect of the present technology, the heat spreader distributes heat among the semiconductor devices during the testing procedure to maintain the semiconductor devices at or near the selected test temperature. In contrast, conventional testing procedures do not include the use of such a heat spreader. Without the heat spreader, the semiconductor devices may be unevenly heated above or below the selected test temperature—increasing the number of false positives (e.g., detected, non-faulty devices) and false negatives (e.g. undetected faulty devices) of the testing procedure.

Numerous specific details of heat spreaders for use in semiconductor device testing, and associated systems and methods, are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-12. For example, some details of semiconductor devices and burn-in testing components well known in the art have been omitted so as not to obscure the present technology. In general, various other devices and systems in addition to those specific embodiments disclosed herein may be within the scope of the present technology.

The term "semiconductor device" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes a semiconductor material. A semiconductor device can include, for example, a semiconductor substrate, wafer, panel, or a single die from a wafer or substrate. A semiconductor device may refer herein to a semiconductor wafer, but semiconductor devices are not limited to semiconductor wafers.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1B:
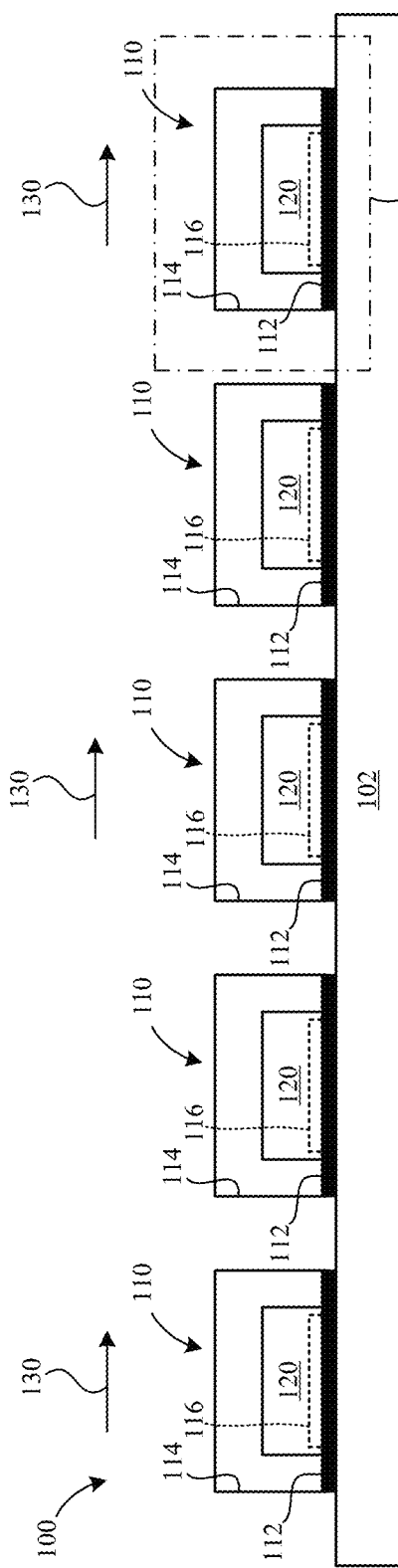
FIG. 1B is a side cross-sectional view of the burn-in board taken along the line 1B-1B in FIG. 1A.
Figure 1C:
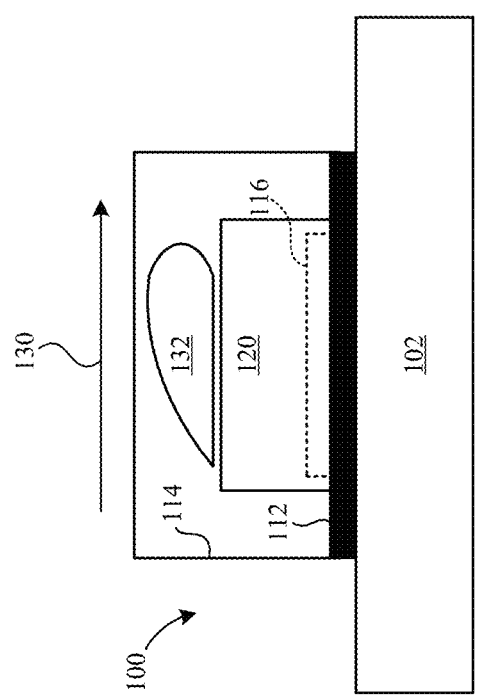
FIG. 1C is an enlarged view of a portion of the burn-in board shown in FIG. 1B.

FIG. 1A is a top view of a burn-in board 100 configured in accordance with embodiments of the present technology. FIG. 1B is a side cross-sectional view of the burn-in board 100 taken along the line 1B-1B in FIG. 1A, and FIG. 1C is an enlarged view of a portion of the burn-in board 100 shown in FIG. 1B. Referring to FIGS. 1A-1C together, the burn-in board 100 includes an electrical substrate 102 and plurality of sockets 110 coupled to the electrical substrate 102. In some embodiments, the electrical substrate 102 can include an electrically-insulating material (e.g., glass, plastic, glass-filled plastic, and/or ceramic) having conductive contacts, traces, etc., disposed in and/or on the electrically-insulating material. For example, in some embodiments the electrical substrate 102 can be a printed circuit board.

Each of the sockets 110 is configured to receive a semiconductor device 120 therein and to electrically couple the semiconductor device 120 to the electrical substrate 102. The semiconductor devices 120 can be semiconductor packages, silicon dies, etc., and can include various memory circuits (e.g., dynamic random memory (DRAM) or other type of memory circuits), controller circuits (e.g., DRAM controller circuits), logic circuits, and/or other circuits. In the illustrated embodiment, the burn-in board 100 includes twenty sockets 110 aligned in rows and columns. In other embodiments, the burn-in board 100 can include any number of sockets 110 (e.g., more or fewer than twenty) that can be arranged in rows and columns, or in another suitable arrangement. Individual ones of the sockets 110 can be spaced apart from and/or abut adjacent ones of the sockets 110. For example, in the illustrated embodiment, the sockets 110 are spaced laterally apart from one another in columns and rows (e.g., a grid arrangement) across the electrical substrate 102. Moreover, in the illustrated embodiment each of the sockets 110 and the semiconductor devices 120 are substantially identical. In other embodiments, the configurations of the sockets 110 and semiconductor devices 120 can differ.

Each of the sockets 110 is configured to receive, hold, and facilitate testing of the semiconductor device 120 positioned therein. More particularly, each of the sockets 110 can include a base portion 112 and a sidewall 114 extending from the base portion 112 that together define a recess configured (e.g., sized and shaped) to receive the semiconductor device 120. Each of the sockets 110 can include a mounting seat 116 (shown schematically in FIGS. 1B and 1C) on/in the base portion 112 and having electrical contacts that are configured to contact and electrically couple to corresponding contacts (e.g., leads) of the semiconductor device 120 positioned therein. The mounting seats 116 are configured to electrically couple the semiconductor devices 120 to testing circuitry (not shown) configured to provide power and electrical test signals to the semiconductor devices 120 during a testing procedure, such as a burn-in test. In some embodiments, the electrical contacts of the mounting seats 116 can have moveable contact portions configured to move into and out of electrical engagement with the respective leads of the semiconductor devices 120. For example, the electrical contacts can include electrical clips, conductive traces, and/or double-ended electrical pogo-pins. In other embodiments, the burn-in board 100 can be a socketless burn-in board in which the mounting seats 116 (and/or other components that include the electrical connections necessary to power and communicate with the semiconductor devices 120) are positioned on a surface of the electrical substrate 102.

The burn-in board 100 is configured to be placed within a heating chamber (e.g., a burn-in heating chamber 1076 shown in FIG. 10) during a procedure for testing the semiconductor devices 120 to, for example, identify failed or failing ones of the semiconductor devices 120 (e.g., those including manufacturing defects). The heating chamber is configured to heat the semiconductor devices 120 to a selected test temperature, such as a temperature at or near a maximum operating temperature of the semiconductor devices 120. The semiconductor devices 120 can be powered/operated during the test procedure via the testing circuitry. In some embodiments, the heating chamber can be part of a burn-in convection oven having temperature cycling capabilities. In some embodiments, the heating chamber is configured to heat the semiconductor devices 120 via convective heat transfer. In the illustrated embodiment, heated air generated within the heating chamber is passed over the burn-in board 100, as indicated by arrows 130, and circulates around the semiconductor devices 120 to heat the semiconductor devices 120.

However, heat may be irregularly distributed to the semiconductor devices 120 during the testing procedure depending on, for example, the position of the semiconductor devices 120 along the burn-in board 100. For example, air pockets (e.g., an air pocket 132 shown in FIG. 1C) may form within one or more of the sockets 110. Such air pockets can impose a significant thermal resistance by inhibiting the circulation of the heated air around the semiconductor devices 120, thereby causing the semiconductor devices 120 to be below/above the selected test temperature during all or a portion of the testing procedure. Furthermore, heat generated by the semiconductor devices 120 during the testing procedure can propagate to other ones of the semiconductor devices 120. For example, the circulating air can carry the heat from upstream ones of the semiconductor devices 120 to downstream ones of the semiconductor devices 120 (e.g., in the direction of arrows 130). This additional heat transfer can increase the temperature of the downstream semiconductor devices 120 above the selected test temperature, which can affect the performance of the semiconductor devices 120 and potentially cause premature failures and degradation. Premature failures caused by excessive heating of the semiconductor devices 120 above the selected test temperature are false positives identified by the testing procedure.

Figure 2C:
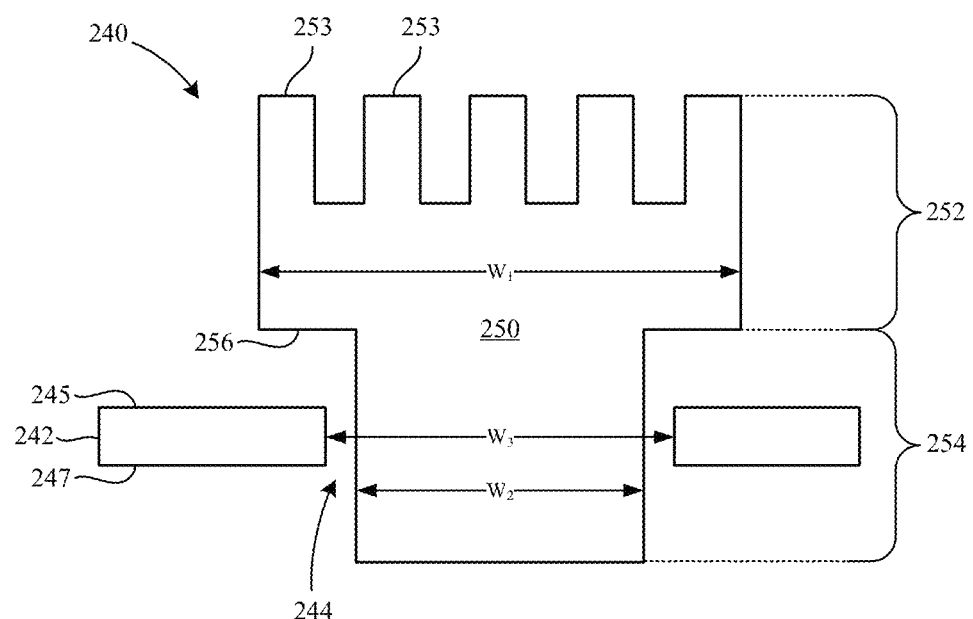
FIG. 2C is an enlarged view of a portion of the heat spreader shown in FIG. 2B.

FIG. 2A is a top view of a heat spreader 240 configured in accordance with embodiments of the present technology. FIG. 2B is a side-cross sectional view of the heat spreader 240 taken along the line 2B-2B in FIG. 2A, and FIG. 2C is an enlarged view of a portion of the heat spreader 240 shown in FIG. 2B. Referring to FIGS. 2A-2C together, in the illustrated embodiment, the heat spreader 240 includes a frame 242 (e.g., a spreader plate, a holder, a plate, etc.) having an upper side 245 and a lower side 247, and a plurality of apertures 244 extending therethrough from the upper side 245 to the lower side 247. The frame 242 can comprise a thermally-conductive material (e.g., aluminum, copper, graphite, etc.), a thermally-insulative material (ceramic, glass, plastic, etc.), and can be rigid or flexible. The heat spreader 240 further includes a plurality of heat sinks 250 (e.g., heat spreader portions, thermally-conductive members, etc.) slidably (e.g., floatably) positioned within corresponding ones of the apertures 244. That is, the heat sinks 250 are positioned to move vertically upward/downward through the corresponding ones of the apertures 244 relative to the frame 242. The heat sinks 250 are formed of one or more thermally conductive materials such as aluminum, copper, graphite, etc.

In the illustrated embodiment, the apertures 244 have a generally rectilinear cross-sectional shape and are arranged in a grid pattern (e.g., in rows and columns) across the frame 242. In other embodiments, the apertures 244 can have other cross-sectional shapes (e.g., oval, circular, polygonal, irregular, etc.) and/or can be positioned differently along the frame 242. In the illustrated embodiment, the heat sinks 250 are generally identical while, in other embodiments, the heat sinks 250 can have varying dimensions, shapes, densities, materials, and/or other characteristics.

Referring to FIG. 2C, in the illustrated embodiment, the heat sinks 250 each include an upper portion 252 including a plurality of fins 253 and a lower portion 254 extending from the upper portion 252. The lower portion 254 is configured to project/extend at least partially through a corresponding one of the apertures 244 in the frame 242. In the illustrated embodiment, the upper portion 252 has a width $W_1$ that is larger than a width $W_2$ of the lower portion 254 such that the heat sink 250 includes a flange surface 256 (e.g., a step) at the interface between the upper and lower portions 252, 254. Moreover, the width $W_1$ of the upper portion 252 can be greater than a width $W_3$ of the aperture 244. Accordingly, when the frame 242 is moved upward relative to the heat sink 250, the upper surface 245 of the frame 242 can engage the flange surface 256 of the heat sink 250 to inhibit the upper portion 252 of the heat sink 250 from moving fully/entirely through the aperture 244. In some such embodiments, the frame 242 can be lifted (e.g., by an operator, automated system, etc.) to engage the frame 242 with the heat sinks 250 (e.g., with the flange surfaces 256). In this manner, each of the separate heat sinks 250 can be moved/manipulated together. In other embodiments, the heat sinks 250 do not include the fins 253 (e.g., include a planar upper surface) and/or can have other heat-dispersing features/configurations.

In the illustrated embodiment, the width $W_2$ of the lower portion 254 is less than the width $W_3$ of the aperture 244 such that the lower portion 254 does not engage/contact the frame 242 when the heat sink 250 is generally centered within the aperture 244. In other embodiments, the width $W_2$ of the lower portion 254 can be substantially equal to the width $W_3$ of the aperture 244 such that the lower portion 254 of the heat sink 250 contacts the frame 242. In some such embodiments, the lower portion 254 thermally engages the frame 242 while still being configured to slide within the aperture 244.

FIG. 3A is a side cross-sectional view of the heat spreader 240 of FIGS. 2A-2C coupled to the burn-in board 100 of FIGS. 1A-1C in accordance with embodiments of the present technology. FIG. 3B is an enlarged view of a portion of the heat spreader 240 and the burn-in board 100 shown in FIG. 3A. Referring to FIGS. 3A and 3B together, in general, the heat spreader 240 is configured to be installed/positioned on/over the burn-in board 100 such that the heat sinks 250 thermally contact corresponding ones of the semiconductor devices 120. By this arrangement, the heat spreader 240 is configured to evenly distribute and dissipate heat across the semiconductor devices 120 during a testing procedure to maintain the semiconductor devices 120 at or near a selected test temperature.

More specifically, in the illustrated embodiment, the apertures 244 in the frame 242 are aligned over the sockets 110 and arranged in a pattern (e.g., a grid) corresponding to the placement of the semiconductor devices 120 on the burn-in board 100. The heat sinks 250 (e.g., the lower portions 254 of the heat sinks 250) project into the sockets 110 such that a lower surface of each heat sink 250 contacts an upper surface of the semiconductor device 120 in the socket 110. Accordingly, the heat sinks 250 can each be thermally coupled to a corresponding of the semiconductor devices 120 to dissipate heat from and/or distribute heat to the semiconductor devices 120. The heat spreader 240 can be configured (e.g., sized and shaped) to cover each of the sockets 110. Accordingly, the heat spreader 240 can have a shape generally corresponding to the dimensions (e.g., width and length) of the burn-in board 100 and/or the arrangement of the sockets 110 positioned thereon.

In other embodiments, the heat spreader 240 can cover only a subset of the semiconductor devices 120 on the burn-in board 100 such that the heat sinks 250 thermally contact only a subset (e.g., a fixed number of rows or columns) of the semiconductor devices 120, or the illustrated heat spreader 240 can include fewer of the heat sinks 250. For example, in some embodiments the heat spreader 240 is configured to cover and/or thermally contact only a subset of the semiconductor devices 120 positioned downstream of the flow of heated air—which are more likely to overheat as described in detail above. That is, the frame 242 can extend over only a subset of the semiconductor devices 120 positioned generally to the right of the page in FIG. 3A (i.e., downstream of the flow of heated air indicated by the arrows 130), and/or the heat sinks 250 can be positioned in corresponding ones of the apertures 244 over only a subset of the semiconductor devices 120 positioned generally to the right of the page in FIG. 3A (i.e., downstream of the flow of heated air indicated by the arrows 130). In some embodiments, the frame 242 can be sized and shaped based on the dimensions of the heating chamber in which the burn-in board 100 is configured to be placed during a testing procedure. For example, the frame 242 can be sized to abut or contact a portion of the heating chamber. In some embodiments, the frame 242 has the same planform shape as the burn-in board 100 such that the sides of the frame 242 are generally flush with the sides of the burn-in board 100.

In the illustrated embodiment, the frame 242 is supported by the sockets 110 (e.g., the sidewalls 114 of the sockets 110) while the heat sinks 250 are supported by corresponding ones of the semiconductor devices 120. In other embodiments, the frame 242 is instead supported by a spring or other support coupled to the burn-in board 100 (e.g., to the electrical substrate 102 as shown in FIGS. 8 and 9) or another attachment point in the heating chamber. For example, the frame 242 can alternatively or additionally be supported by a clamp, a holder, a shelving of the heating chamber, or another portion of the heating chamber.

Referring to FIG. 3B, a lower surface 357 of each of the heat sinks 250 is configured to thermally contact an upper surface 347 of a corresponding one of the semiconductor devices 120. In some embodiments, a thermal interface material, thermal grease, thermally-conductive pad, etc., can be positioned between the lower surface 357 of the heat sink 250 and the upper surface 347 of the semiconductor device 120 and can thermally couple the semiconductor device 120 to the heat sink 250. In some embodiments, the lower surface 357 of the heat sink 250 is configured (e.g., sized and shaped) to contact all or substantially all the upper surface 347 of the semiconductor device 120. For example, in the illustrated embodiment, the lower surface 357 of the heat sink 250 has substantially the same shape and area as the upper surface 347 of the semiconductor device 120. In other embodiments, the lower surface 357 of the heat sink 250 can be larger than (e.g., over-sized compared to) the upper surface 347 of the semiconductor device 120. In other embodiments, the lower surface 357 of the heat sink 250 can be smaller in at least one dimension than the upper surface 347 of the semiconductor device 120. Moreover, in the illustrated embodiment, the lower surface 357 of the heat sink 250 has a generally planar shape. In other embodiments, the lower surface 357 can be contoured (e.g., including one or more recesses, curves, etc.), can include one or more bumps or projections, etc.

In some embodiments, the heat sink 250 is configured to thermally contact the semiconductor device 120 while the upper portion 252 of the heat sink 250 is spaced apart from the frame 242. That is, a height $H_1$ (e.g., a thickness, depth, etc.) of the lower portion 254 of the heat sink 250 can be larger than (i) a difference between a height H2 of the sidewall 114 of the corresponding one of the sockets 110 and a height H3 of the semiconductor device 120 therein and (ii) a height H4 of the frame 242. By this arrangement, the heat sink 250 has room to move vertically relative to the frame 242 while still maintaining good thermal contact with the semiconductor device 120. For example, the heat sink 250 can move and maintain good thermal contact as the burn-in board 100 (e.g., the electrical substrate 102) and/or the frame 242 flexes, warps, bends, etc., during a testing procedure, such as a burn-in test.

Figure 4A:
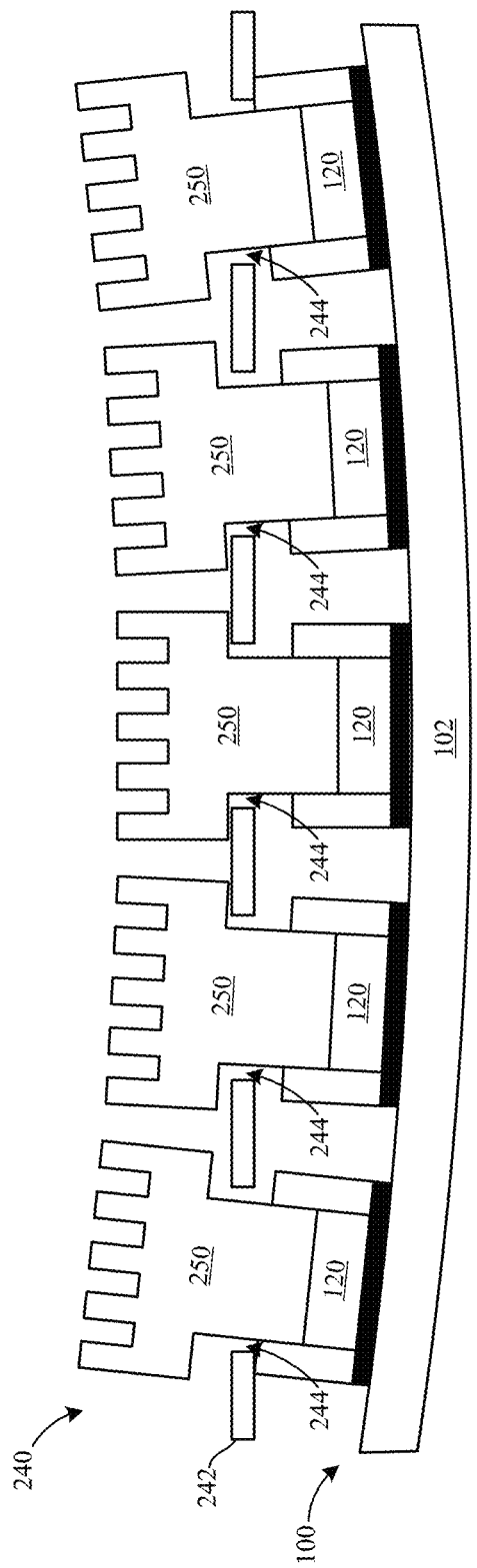
FIGS. 4A and 4B are side cross-sectional views of the heat spreader coupled to the burn-in board and illustrating warpage of an electrical substrate of the burn-in board and a frame of the heat spreader, respectively, in accordance with embodiments of the present technology.
Figure 4B:
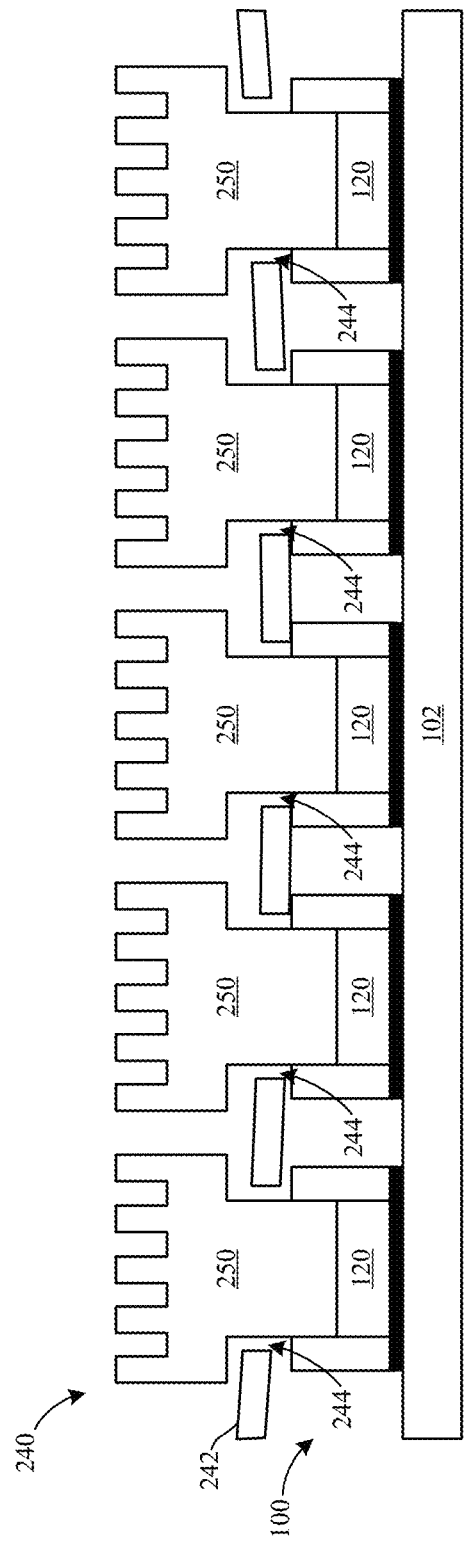

More specifically, FIGS. 4A and 4B, are side cross-sectional views of the heat spreader 240 coupled to the burn-in board 100 and illustrating warpage of the electrical substrate 102 of the burn-in board 100 and the frame 242 of the heat spreader 240, respectively, in accordance with embodiments of the present technology. As shown in FIG. 4A, as the electrical substrate 102 warps, the heat sinks 250 can move vertically and/or horizontally (e.g., at angle) through the apertures 244 of the frame 242 to maintain thermal contact with the semiconductor devices 120. Similarly, as show in FIG. 4B, as the frame 242 warps, the frame 242 can move relative to the heat sinks 250 without affecting the orientation/placement of the heat sinks 250 such that the heat sinks 250 remain in thermal contact with the semiconductor devices 120. Accordingly, in one aspect of the present technology the heat spreader 240 is configured to thermally contact each of the semiconductor devices 120 even as various components warp during a testing procedure. In contrast, an integral or single piece heat spreader may be pulled out of thermal contact with some of or all the semiconductor devices 120 because of warpage.

Referring again to FIGS. 3A and 3B together, in other embodiments the heat sinks 250 can have different dimensions/configurations (e.g., different heights $H_1$) to, for example, accommodate testing of different semiconductor devices 120 and/or the use different sockets 110. In some embodiments, the heat sinks 250 can be heavy enough to provide a robust thermal coupling (e.g., suitable contact) between the lower portions 254 and the semiconductor devices 120 in the sockets 110 without the need for a thermal interface material therebetween. In some embodiments, an additional weight/force (not shown) can be applied to the heat sinks 250 to improve the contact and thermal coupling between the heat sinks 250 and the semiconductor devices 120. In some embodiments, some of or all the heat sinks 250 can have different thermal conductivities to, for example, compensate for irregularities of temperature distribution across the burn-in board 100. For example, downstream ones of the heat sinks 250 can be relatively more thermally conductive than upstream ones of the heat sinks 250 or vis versa.

The heat spreader 240 is configured to be installed onto the burn-in board 100 (e.g., before the burn-in board 100 is placed within the heating chamber) for testing the semiconductor devices 120. For example, heat spreader 240 can be lifted and placed onto the burn-in board 100. As the heat spreader 240 is lifted, the frame 242 supports/carries the heat sinks 250 (e.g., the upper surface 245 of the frame 242 engages the flange surfaces 256 of the heat sinks 250) such that the separate heat sinks 250 are all movable and positionable together. In some embodiments, the heat spreader 240 is passively secured to the burn-in board 100 while, in other embodiments, the heat spreader 240 (e.g., the frame 242) is clamped, fastened, or otherwise secured to the burn-in board 100.

During a testing procedure, when the heat spreader 240 and the burn-in board 100 are placed within the heating chamber, the heat sinks 250 absorb/transmit heat to/from the heated air (e.g., flowing in the direction of arrows 130) and the semiconductor devices 120. For example, the heat sinks 250 can absorb heat from the air and distribute it to the corresponding semiconductor devices 120—via the thermal coupling between the lower portions 254 of the heat sinks 250 and the semiconductor devices 120—to heat the semiconductor devices 120 to a selected test temperature. At the same time, the heat sinks 250 can absorb, redistribute, and/or dissipate heat from the semiconductor devices 120 that are above the selected test temperature. Moreover, because the heat sinks 250 extend into the sockets 110 to contact the semiconductor devices 120, the heat sinks 250 can inhibit or even prevent air pockets (e.g., the air pocket 132 shown in FIG. 1B) from forming in the sockets 110. Accordingly, in one aspect of the present technology the heat spreader 240 operates to evenly distribute heat across the burn-in board 100 and the semiconductor devices 120. The heat spreader 240 can therefore help ensure that all the semiconductor devices 120 are at or near the selected test temperature during the testing procedure, which can reduce the number of false positives (i.e., the identification of semiconductor devices that failed the testing procedure only because they were above the selected test temperature during the testing procedure) and/or false negatives (i.e., the failure to identify faulty semiconductor devices that passed the testing procedure only because they were below the selected test temperature during the testing procedure).

FIG. 5 is a side cross-sectional view of the burn-in board 100 of FIGS. 1A-1C having a heat spreader 540 coupled thereto in accordance with another embodiment of the present technology. The heat spreader 540 can include features generally similar or identical to the features of the heat spreader 240 described in detail with reference to FIGS. 2A-4B. For example, the heat spreader 540 includes a frame 542 having a plurality of apertures 544 extending between an upper surface 545 and a lower surface 547 thereof, and a plurality of heat sinks 550 projecting through the apertures 544 into the sockets 110 to thermally contact the semiconductor devices 120. In the illustrated embodiment, however, an upper portion of each the heat sinks 550 engages the frame 542. Accordingly, the heat sinks 550 can be supported by the semiconductor devices 120 and/or the sidewalls 114 of the sockets 110 (e.g., via the frame 542 which rests thereon) while still thermally contacting the semiconductor devices 120.

FIG. 6 is a side cross-sectional view of the burn-in board 100 of FIGS. 1A-1C having a heat spreader 640 coupled thereto in accordance with another embodiment of the present technology. The heat spreader 640 can include features generally similar or identical to the features of the heat spreaders 240 and/or 540 described in detail with reference to FIGS. 2A-5. For example, the heat spreader 640 includes a frame 642 having a plurality of apertures 644 extending between an upper surface 645 and a lower surface 647 thereof, and a plurality of heat sinks 650 projecting through the apertures 644 into the sockets 110 to thermally contact the semiconductor devices 120. In the illustrated embodiment, however, the upper surface of the frame 642 is coupled to the heat sinks 650 (e.g., to an upper flange portion of each of the heat sinks 650) and does not contact the sidewalls 114 of the sockets 110. In one aspect of the present technology, this arrangement can prevent or relieve pressure on the sockets 110 while still permitting the heat spreader 640 to thermally contact the semiconductor devices 120. In some embodiments, the frame 642 can be flexible to permit the heat sinks 650 to move relative to one another to, for example, maintain thermal contact even as the burn-in board 100 and/or the frame 642 warps during a testing procedure (e.g., as shown in FIGS. 4A and 4B).

Figure 7:
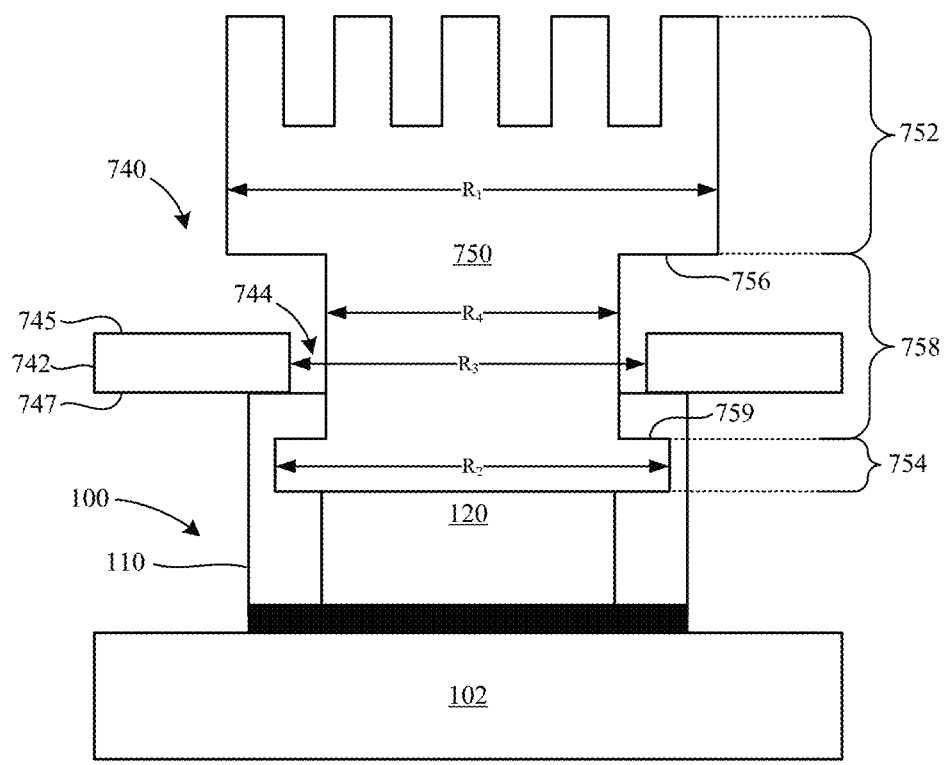
FIG. 7 is an enlarged side cross-sectional view of the burn-in board of FIGS. 1A-1C having a heat spreader coupled thereto in accordance with another embodiment of the present technology.

FIG. 7 is an enlarged side cross-sectional view of the burn-in board 100 of FIGS. 1A-1C having a heat spreader 740 coupled thereto in accordance with another embodiment of the present technology. The heat spreader 740 can include features generally similar or identical to the features of the heat spreaders 240, 540, and/or 640 described in detail with reference to FIGS. 2A-6. For example, the heat spreader 740 includes a frame 742 having a plurality of apertures 744 (only a single aperture 744 is shown in the enlarged view of FIG. 7) extending between an upper surface 745 and a lower surface 747 thereof, and a plurality of heat sinks 750 projecting through the apertures 744 into the sockets 110 to thermally contact the semiconductor devices 120 (only a single heat sink 750 is shown in the enlarged view of FIG. 7).

In the illustrated embodiment, the heat sink 750 includes an upper portion 752 having a width $R_1$, a lower portion 754 having a width $R_2$, and an intermediate portion 758 between the upper and lower portions 752, 754 and having a width $R_4$. The intermediate portion 758 projects through the aperture 744 and is slidably positioned within the aperture 744. Both the width $R_1$ of the upper portion 752 and the width $R_2$ of the lower portion 754 are greater than the width $R_4$ of the intermediate portion 758 such that that the heat sink 750 includes (i) an upper flange surface 756 (e.g., a step) at the interface between the upper and intermediate portions 752, 758 and (ii) a lower flange surface 759 at the interface between the lower and intermediate portions 754, 758. Moreover, both the width $R_1$ of the upper portion 752 and the width $R_2$ of the lower portion 754 are greater than a width $R_3$ of the aperture 744. Accordingly, when the frame 742 is moved upward relative to the heat sink 750, the upper surface 745 of the frame 742 can engage the upper flange surface 756 of the heat sink 750 to inhibit the upper portion 752 of the heat sink 750 from moving fully through the aperture 744. Similarly, when the frame 742 is moved downward relative to the heat sink 750, the lower surface 747 of the frame 742 can engage the lower flange surface 759 of the heat sink 750 to inhibit the lower portion 754 of the heat sink 750 from moving fully through the aperture 744. In some embodiments, the frame 742 can be lifted (e.g., by an operator) to engage the frame 742 with the heat sinks 750 (e.g., the upper flange surfaces 756) to move the individual heat sinks 750 as a group. Moreover, the frame 742 can be flipped over without causing the heat sinks 750 to fall out of the apertures 744 because the lower portions 754 of the heat sink 750 inhibit movement therethrough. That is, the heat sinks 750 can be locked, secured, etc., within the apertures 744 of the frame 742.

FIG. 8 is a side-cross sectional view of the heat spreader 240 of FIGS. 2A-2C coupled to the burn-in board 100 of FIGS. 1A-1C in accordance with another embodiment of the present technology. In the illustrated embodiment, the frame 242 of the heat spreader 240 is supported by a stand 860

(e.g., a support, support member, frame, platform, base, etc.). More particularly, the stand 860 can extend between the lower surface 247 of the frame 242 and the electrical substrate 102 of the burn-in board 100. In general, the stand 860 can be positioned anywhere between the burn-in board 100 and the frame 242 to fully or partially support the frame 242. In the illustrated embodiment, the stand 860 is positioned around and between an outer periphery of the burn-in board 100 and an outer periphery of the frame 242. The stand 860 can extend around the entire outer peripheries of the burn-in board 100 and the frame 242, or only a portion or portions of the outer peripheries. In some embodiments, the stand 860 can additionally or alternatively be positioned between the sockets 110 across all or a portion of the burn-in board 100. The stand 860 can comprise any suitably strong material (e.g., metal, plastic, etc.) and can be permanently or releasably attached to the burn-in board 100 and/or the frame 242. In some embodiments, the stand 860 can comprise a portion of the frame 242. In other embodiments, the stand 860 can extend between the frame 242 and a portion of the heating chamber. For example, the frame 242 could be supported by a sidewall of the heating chamber, a rack disposed within the heating chamber, etc.

In the illustrated embodiment, the stand 860 supports the frame 242 above the sockets 110 such that the frame 242 does not rest on the sockets 110 (e.g., such that the frame 242 is spaced apart from the sidewalls 114 of the sockets 110). In one aspect of the present technology, this arrangement can prevent or relieve pressure on the sockets 110 while still permitting the heat sinks 250 to thermally contact the semiconductor devices 120. In some embodiments, a soft material (e.g., foam) can be positioned between the sockets 110 and the frame 242 to inhibit the frame 242 from damaging or putting excessive pressure on the sockets 110.

FIG. 9 is a side-cross sectional view of the heat spreader 240 of FIGS. 2A-2C coupled to the burn-in board 100 of FIGS. 1A-1C in accordance with another embodiment of the present technology. In the illustrated embodiment, the frame 242 is supported by a plurality of springs 962 rather than a stand. More particularly, the springs 962 can extend between the lower surface 247 of the frame 242 and the electrical substrate 102. The springs 962 can be positioned anywhere between the burn-in board 100 and the frame 242 to fully or partially support the frame 242. For example, in the illustrated embodiment, the springs 962 are positioned at and between an outer periphery of the burn-in board 100 and an outer periphery of the frame 242. In some embodiments, the springs 962 can additionally or alternatively be positioned between the sockets 110 across all or a portion of the burn-in board 100. In other embodiments, the springs 962 can extend between the frame 242 and a portion of the heating chamber. For example, the springs 962 could be coupled between the frame 242 and a sidewall of the heating chamber, a rack disposed within the heating chamber, etc. The springs 962 can support the frame 242 above the sockets 110 such that the frame 242 does not rest on the sockets 110 (e.g., the sidewalls 114 of the sockets 110). In one aspect of the present technology, the springs 962 are configured to dampen external forces—for example, forces arising when the burn-in board 100 is moved into or from the heating chamber—to inhibit or even prevent the frame 242 from damaging the semiconductor devices 120 while still permitting the heat sinks 250 to thermally contact the semiconductor devices 120.

Figure 10:
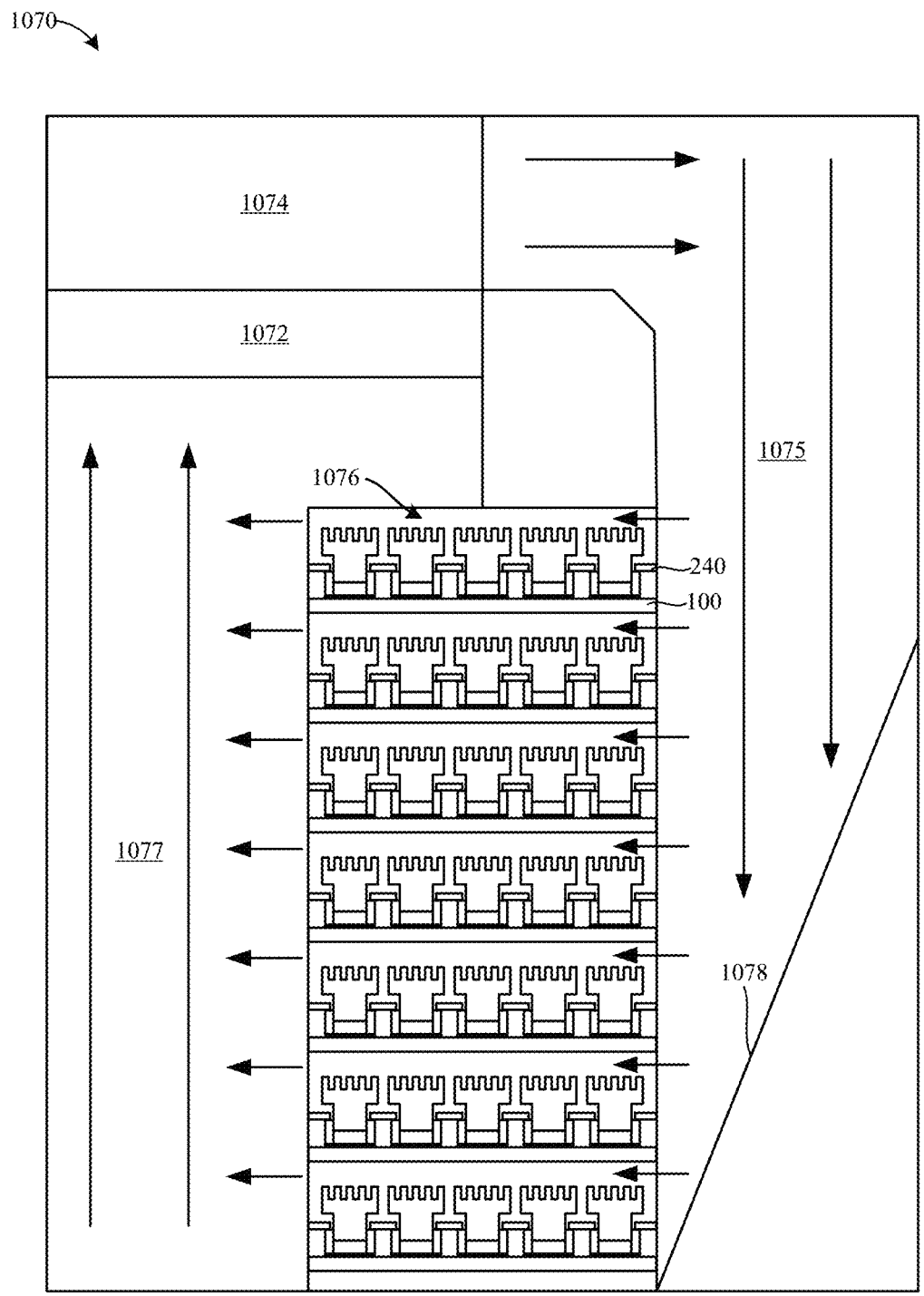
FIG. 10 is a partially schematic, side cross-sectional view of a burn-in test system configured in accordance with embodiments of the present technology.

FIG. 10 is a partially schematic, side cross-sectional view of a burn-in test system 1070 ("system 1070") configured in accordance with embodiments of the present technology. In the illustrated embodiment, the system 1070 is a convection-heating system including a heater 1072, a blower or fan 1074, an inflow duct 1075, a heating chamber 1076, and an outflow duct 1077. A plurality of the burn-in boards 100 (FIGS. 1A-1C) are positioned within the heating chamber 1076 and coupled to corresponding heat spreaders (e.g., the heat spreader 240 shown in FIGS. 2A-3B). In the illustrated embodiment, the burn-in boards 100 are arranged in a stack and spaced apart from one another. The height H4 of the frame 242 (FIG. 3B) of each of the heat spreaders 240 can be selected such that there is a gap or channel between each of the burn-in boards 100 in the stack. The burn-in boards 100 and coupled heat spreaders 240 can be selectively inserted and removed from the heating chamber 1076 to facilitate loading/unloading of the semiconductor devices 120. In some embodiments, the burn-in boards 100 can be inserted into racks in the heating chamber 1076 and plugged into corresponding edge connectors (not shown) configured to electrically couple the burn-in boards 100 and the semiconductor devices 120 to external testing circuitry (not shown).

Referring to FIGS. 2A-3B and 10 together, in operation during a testing procedure, the system 1070 is configured to circulate heated air or other inert gases (e.g., represented by arrows in FIG. 10) past the burn-in boards 100 to heat the semiconductor devices 120 to a selected test temperature. More particularly, the heater 1072 is configured to heat the air (e.g., via a resistive heating element, electrical heating element, etc.) and the blower 1074 is configured to direct the heated air into the inflow duct 1075. In some embodiments, the inflow duct 1075 includes a plate 1078 (e.g., a kicker plate) configured to guide the heated air from the inflow duct 1075 into the heating chamber 1076 and past the burn-in boards 100. The plate 1078 can be angled relative to the heating chamber 1076 to provide a substantially equal rate of air flow across/past the different burn-in boards 100. The heated air then flows through the spaces between the burn-in boards 100 (e.g., over/under/around the burn-in boards 100) to the outflow duct 1077, where the air is recirculated to the heater 1072. As described in detail above, the heat spreaders 240 are thermally coupled to the semiconductor devices 120 on each of the burn-in boards 100 and operate to evenly distribute heat amongst the semiconductor devices 120 such that the semiconductor devices 120 are maintained at or near the selected test temperature during the duration of the testing procedure.

Figures 11A, 11B:
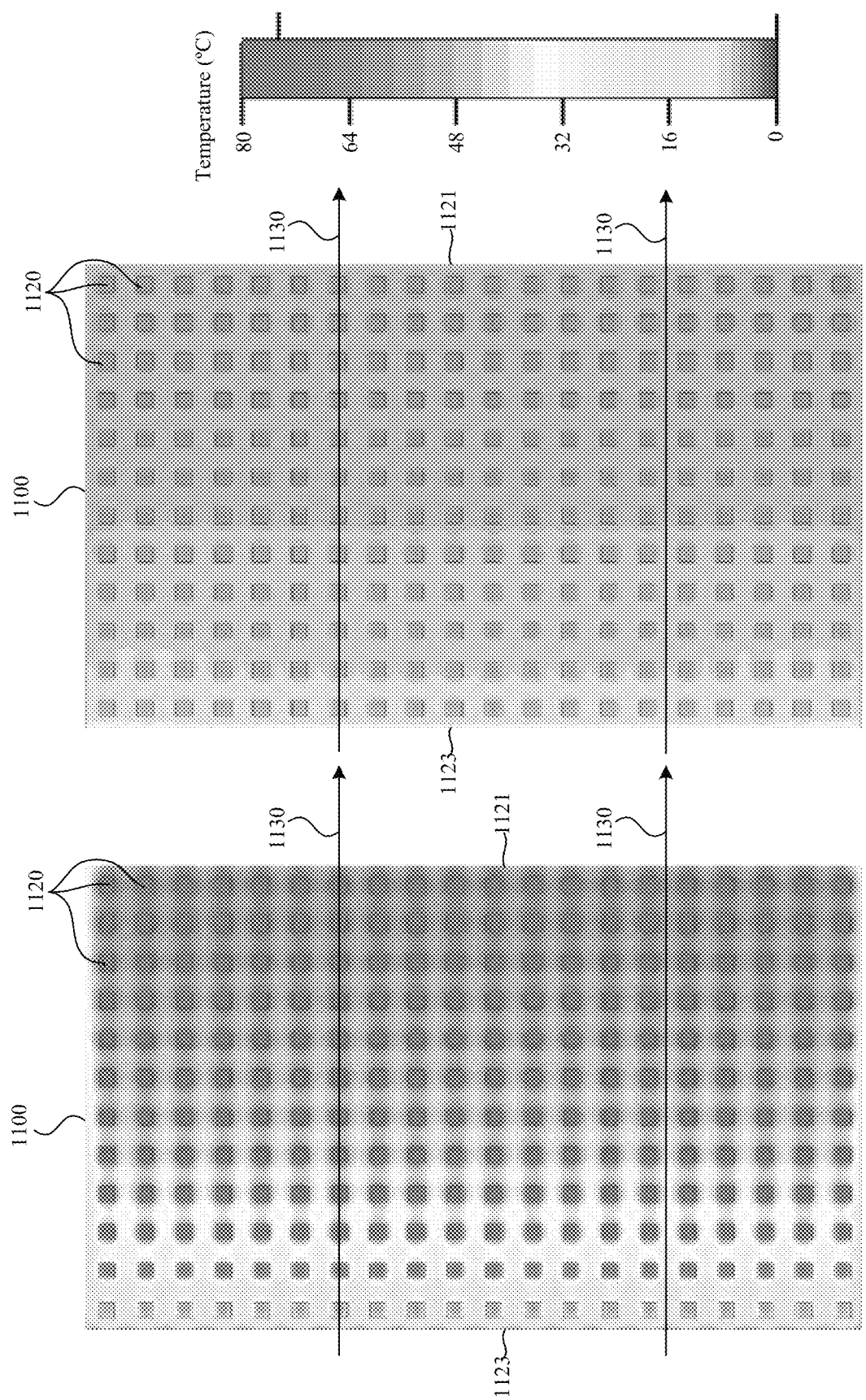
FIG. 11A is a top view of a burn-in board illustrating a temperature distribution across a plurality of semiconductor devices during a burn-in test without a heat spreader coupled to the burn-in board.
FIG. 11B is a top view of the burn-in board illustrating the temperature distribution across the plurality of semiconductor devices during a burn-in test with a heat spreader coupled to the burn-in board.

FIG. 11A is a top view of a burn-in board 1100 illustrating a temperature distribution across a plurality of semiconductor devices 1120 during a burn-in test without a heat spreader coupled to the burn-in board 1100. FIG. 11B is a top view of the burn-in board 1100 illustrating the temperature distribution across the plurality of semiconductor devices 1120 during a burn-in test with a heat spreader (e.g., one the heat spreaders 240, 540, 640, and/or 740) coupled to the burn-in board 1100. Referring to FIGS. 11A and 11B together, heated air passes over the burn-in board 1100 in the direction indicated by arrows 1130 (e.g., as the air travels through the heating chamber 1076 from the inflow duct 1075 to the outflow duct 1077 shown in FIG. 10).

Referring to FIG. 11A, without the heat spreader, the temperature of the semiconductor devices 1120 has as a significant gradient that generally increases in the direction of air flow such that the temperature of downstream ones of the semiconductor devices 1120 is significantly hotter than the temperature of upstream ones of the semiconductor devices 1120. That is, the temperature of the semiconductor devices 1120 proximate a downstream side 1121 of the burn-in board 1100 can be significantly hotter than a temperature of the semiconductor devices 1120 proximate an opposing upstream side 1123 of the burn-in board 1100. Referring to FIG. 11B, with the heat spreader thermally coupled to the semiconductor devices 1120, the temperature gradient across the burn-in board 1100 (e.g., between the sides 1121, 1123) can be generally uniform, or at least significantly less than the temperature gradient without the heat spreader (FIG. 11A). Accordingly, the heat spreaders of the present technology can significantly improve the temperature uniformity across the burn-in board 1100 and can maintain the semiconductor devices 1120 at or near a selected test temperature.

Figure 12:
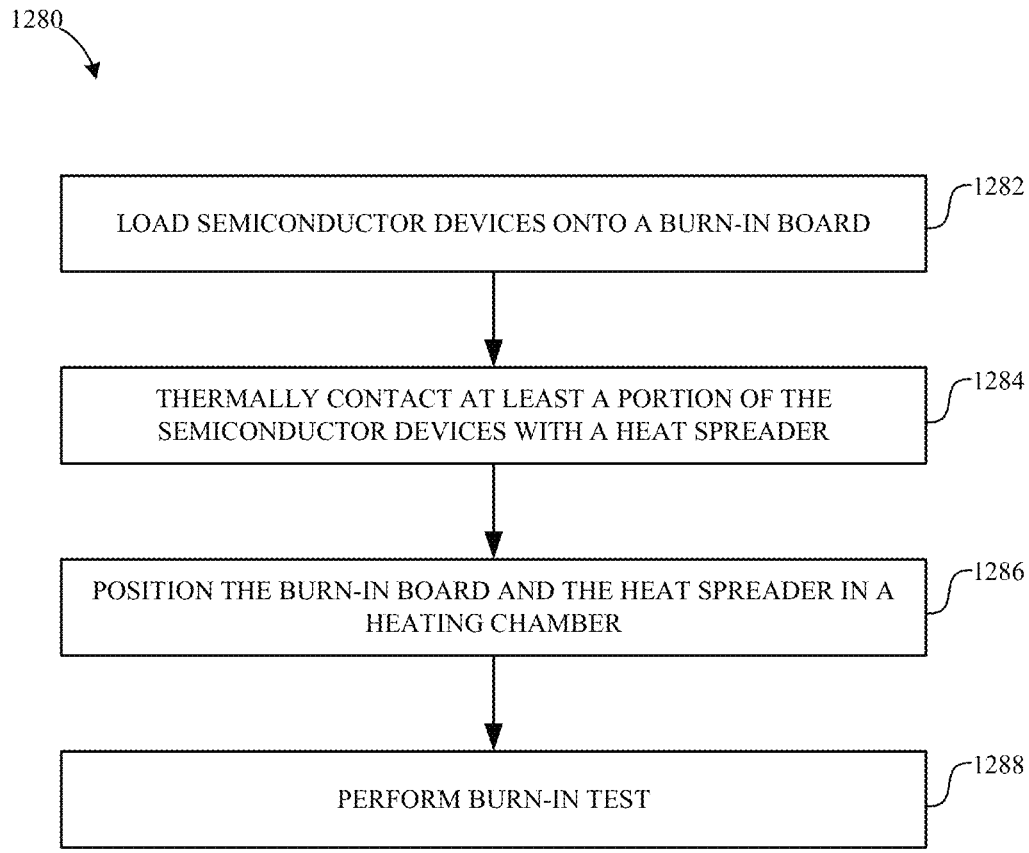
FIG. 12 is a flow diagram of a process or method for performing a burn-in test in accordance with embodiments of the present technology.

FIG. 12 is a flow diagram of a process or method 1280 for performing a burn-in test in accordance with embodiments of the present technology. The method 1280 can be implemented, for example, using the burn-in board 100, the heat spreader 240 (or the heat spreader 540, the heat spreader 640, the heat spreader 740, etc.), and/or the system 1070 described in detail above with reference to FIGS. 1A-10. Accordingly, for the sake of illustration, some features of the method 1280 will be described in the context of the embodiments shown in FIGS. 1A-10.

Beginning at block 1282, the method 1280 includes loading the semiconductor devices 120 onto the burn-in board 100. For example, the semiconductor devices 120 can be electrically coupled to the mounting seats 116 in the sockets 110. At block 1284, the method 1280 includes thermally contacting at least a portion (e.g., a subset) of the semiconductor devices 120 with the heat spreader 240. For example, the frame 242 can be lifted and placed over the burn-in board 100 such that the heat sinks 250 of the heat spreader 240 project into the sockets 110 to thermally contact the semiconductor devices 120. In some embodiments, the frame 242 can be positioned on a spring or stand (e.g., the stand 860 and/or the springs 962 illustrated in FIGS. 8 and 9, respectively). In some embodiments, each of the semiconductor devices 120 loaded on the burn-in board 100 at least partially contacts a respective heat sink 250 of the heat spreader 240.

At block 1286, the method includes positioning the burn-in board 100 and the heat spreader 240 in a heating chamber (e.g., the heating chamber 1076 of the system 1070). For example, the burn-in board 100 can be positioned on a rack or other support within the heating chamber 1076 and electrically coupled to testing circuitry. At block 1288, the method includes performing a burn-in test. For example, the heating chamber 1076 can be heated to a selected test temperature for a predetermined amount of time while the semiconductor devices 120 are electrically activated, exercised, cycled, biased, etc. More specifically, the heater 1072 of the system 1070 can heat the air and the blower 1074 can direct the heated air into the inflow duct 1075 and to the plate 1078, which guides the heated air from the inflow duct 1075 into the heating chamber 1076 to heat the semiconductor devices 120 on the burn-in board 100.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments may perform steps in a different order. Moreover, the various embodiments described herein may also be combined to provide further embodiments.

Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Further, while advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A heat spreader configured to be coupled to a burn-in testing board including a plurality of sockets, the heat spreader comprising:
    a frame including a plurality of apertures; and
    a plurality of heat sinks floatably positioned within corresponding ones of the apertures such that the heat sinks are not fixedly attached to the frame;
    wherein, when the heat spreader is coupled to the burn-in testing board, the heat sinks are configured to thermally contact a corresponding one of a plurality of semiconductor devices positioned within the sockets.

2. The heat spreader of claim 1 wherein the heat sinks are configured to at least partially extend into corresponding ones of the sockets when the heat spreader is coupled to the burn-in testing board.

3. The heat spreader of claim 2 wherein—
    the apertures are configured to be aligned over corresponding ones of the sockets when the heat spreader is coupled to the burn-in testing board,
    individual ones of the heat sinks include (a) an upper portion having a first width and (b) a lower portion extending from the upper portion and having a second width,
    the first width is larger than a width of the corresponding one of the apertures such that the upper portion cannot pass through the aperture, and
    the second width is less than or equal to the width of the corresponding one of the apertures such that the lower portion can pass through the aperture.

4. The heat spreader of claim 2 wherein—
    the apertures are configured to be aligned over corresponding ones of the sockets when the heat spreader is coupled to the burn-in testing board,
    individual ones of the heat sinks include (a) an upper portion having a first width, (b) a lower portion having a second width, and (c) an intermediate portion extending between the upper and lower portions and having a third width, the first width is larger than a width of the corresponding one of the apertures such that the heat sink cannot pass entirely through the aperture in a first direction, the second width is larger than the width of the corresponding one of the apertures such that the heat sink cannot pass entirely through the aperture in a second direction opposite the first direction, and the third width is less than the width of the corresponding one of the apertures such that the heat sink can pass through the aperture along a length of the intermediate portion.

5. The heat spreader of claim 1 wherein the heat sinks are configured to contact the frame when the heat spreader is coupled to the burn-in testing board.

6. The heat spreader of claim 1 wherein the heat sinks are configured to be spaced apart from the frame when the heat spreader is coupled to the burn-in testing board.

7. The heat spreader of claim 1 wherein the heat sinks each include a lower surface configured to contact an upper surface of the corresponding one of the semiconductor devices when the heat spreader is coupled to the burn-in testing board, and wherein the lower surface has a larger surface area than the upper surface.

8. The heat spreader of claim 1 wherein the heat sinks each include a lower surface configured to contact an upper surface of the corresponding one of the semiconductor devices when the heat spreader is coupled to the burn-in testing board, and wherein lower surface has substantially the same surface area as the upper surface.

9. The heat spreader of claim 1 wherein the heat sinks each include a lower surface configured to contact an upper surface of the corresponding one of the semiconductor devices when the heat spreader is coupled to the burn-in testing board, and wherein the lower surface has substantially the same shape as the upper surface.

10. The heat spreader of claim 1 wherein the frame of the heat spreader is configured to contact a stand when the heat spreader is coupled to the burn-in testing board such that the frame is spaced apart from the sockets.

11. The heat spreader of claim 1 wherein the frame of the heat spreader is configured to contact a spring when the heat spreader is coupled to the burn-in testing board such that the frame is spaced apart from the sockets.

12. A heat spreader configured to be coupled to a burn-in testing board including a plurality of sockets, the heat spreader comprising:
a frame including a plurality of apertures; and
a plurality of heat sinks floatably positioned within corresponding ones of the apertures such that the heat sinks are disconnected from the frame;
wherein, when the heat spreader is coupled to the burn-in testing board, the heat sinks are configured to extend into corresponding ones of the sockets and thermally contact a corresponding one of a plurality of semiconductor devices positioned within the sockets.

13. The heat spreader of claim 12 wherein—
the apertures are configured to be aligned over corresponding ones of the sockets when the heat spreader is coupled to the burn-in testing board,
individual ones of the heat sinks include (a) an upper portion having a first width and (b) a lower portion extending from the upper portion and having a second width,
the first width is larger than a width of the corresponding one of the apertures such that the upper portion cannot pass through the aperture, and
the second width is less than or equal to the width of the corresponding one of the apertures such that the lower portion can pass through the aperture.

14. The heat spreader of claim 12 wherein the heat sinks are configured to contact the frame when the heat spreader is coupled to the burn-in testing board.

15. The heat spreader of claim 12 wherein the heat sinks are configured to be spaced apart from the frame when the heat spreader is coupled to the burn-in testing board.

16. The heat spreader of claim 12 wherein the frame is flexible.

17. A system for use in testing a plurality of semiconductor devices, the system including:
a burn-in board including a plurality of sockets, wherein the sockets are configured to receive corresponding ones of the semiconductor devices therein; and
a heat spreader configured to be releasably coupled to the burn-in board,
wherein the heat spreader includes (a) a frame having a plurality of apertures and (b) a plurality of separate heat sinks,
wherein individual ones of the heat sinks are floatably positioned within corresponding ones of the apertures such that the heat sinks are disconnected from the frame, and
wherein the heat sinks are sized and shaped to extend through corresponding ones of the apertures into corresponding ones of the sockets to thermally contact a corresponding one of the semiconductor devices when the heat spreader is coupled to the burn-in board.

18. The system of claim 17 wherein the frame is flexible.

19. The system of claim 17 wherein the heat sinks are configured to contact the frame when the heat spreader is coupled to the burn-in testing board.

20. The system of claim 17 wherein the heat sinks are configured to be spaced apart from the frame when the heat spreader is coupled to the burn-in testing board.

* * * * *